(12) United States Patent
Aoki et al.

(10) Patent No.: US 9,028,658 B2
(45) Date of Patent: May 12, 2015

(54) MN-CONTAINING COPPER ALLOY SPUTTERING TARGET GENERATING FEW PARTICLES

(75) Inventors: Shoji Aoki, Hiratsuka (JP); Masahiko Wada, Tokyo (JP); Masato Koide, Osaka (JP)

(73) Assignee: Mitsubishi Materials Corporation, Tokyo (JP)

( * ) Notice: Subject to any disclaimer, the term of this patent is extended or adjusted under 35 U.S.C. 154(b) by 1023 days.

(21) Appl. No.: 12/063,879

(22) PCT Filed: Aug. 17, 2006

(86) PCT No.: PCT/JP2006/316182
§ 371 (c)(1),
(2), (4) Date: Feb. 15, 2008

(87) PCT Pub. No.: WO2007/020981
PCT Pub. Date: Feb. 22, 2007

(65) Prior Publication Data
US 2009/0101495 A1 Apr. 23, 2009

(30) Foreign Application Priority Data
Aug. 19, 2005 (JP) .................................. 2005-238171

(51) Int. Cl.
| | |
|---|---|
| *C23C 14/34* | (2006.01) |
| *C22C 9/05* | (2006.01) |
| *H01J 37/34* | (2006.01) |
| *C23C 14/16* | (2006.01) |

(Continued)

(52) U.S. Cl.
CPC ............... *C23C 14/3414* (2013.01); *C22C 9/05* (2013.01); *H01J 37/3426* (2013.01); *C23C 14/16* (2013.01); *H01L 21/2855* (2013.01); *H01L 21/76831* (2013.01); *H01L 21/76843* (2013.01); *H01L 21/76873* (2013.01)

(58) Field of Classification Search
USPC ........................................ 204/298.12, 298.13
See application file for complete search history.

(56) References Cited

U.S. PATENT DOCUMENTS 6,001,227 A * 12/1999 Pavate et al. ............. 204/298.12
2003/0052000 A1* 3/2003 Segal et al. ............... 204/298.13

FOREIGN PATENT DOCUMENTS

JP 57076101 A * 5/1982

(Continued)

OTHER PUBLICATIONS

English Translation Abstract, JP57076101A to Abe, published May 1982.*

(Continued)

*Primary Examiner* — Jason M Berman
(74) *Attorney, Agent, or Firm* — Leason Ellis LLP

(57) ABSTRACT

A Mn-containing copper alloy sputtering target is provided. The target generates a small number of particles and is used to form diffusion inhibiting films and seed films of interconnects of semiconductor devices simultaneously. The target is a Mn-containing copper alloy sputtering target that generates few particles, comprising a copper alloy containing 0.6 to 30 mass % of Mn with the balance consisting of copper and impurities, wherein the impurities are controlled to include a total of 40 ppm or less of metallic impurities, 10 ppm or less of oxygen, 5 ppm or less of nitrogen, 5 ppm or less of hydrogen, and 10 ppm or less of carbon.

1 Claim, 1 Drawing Sheet

(51) Int. Cl.
*H01L 21/285* (2006.01)
*H01L 21/768* (2006.01)

(56) References Cited

FOREIGN PATENT DOCUMENTS

| JP | 63238268 A | * 10/1988 |
| JP | 2006-73863 A | 3/2006 |
| WO | 2005/021828 A2 | 3/2005 |

OTHER PUBLICATIONS

"Low resistive and highly reliable Cu dual-damascene interconnect technology using self-formed MnSi/sub x/O/sub y/barrier" by Usui et al., presentation of on IITC, Jun. 8, 2005.
"Development of high-performance highly reliable Cu intereconnect process bound for post 45 nm generation. Self formation of MnSixOy barrier layer using CuMn alloy" by Senmiconductor Technology Academic Research Center (STARC) (http://www.starc.jp/index-j.html) on Jun. 8, 2005 and its English translation.

* cited by examiner

MN-CONTAINING COPPER ALLOY SPUTTERING TARGET GENERATING FEW PARTICLES

CROSS-REFERENCE TO PRIOR APPLICATION

This is a U.S. National Phase application under 35 U.S.C. §371 of International Patent Application No. PCT/JP2006/316182 filed Aug. 17, 2006, and claims the benefit of Japanese Patent Application No. 2005-238171 filed Aug. 19, 2005, both of which are incorporated by reference herein. The International Application was published in Japanese on Feb. 22, 2007 as WO 2007/020981 A1 under PCT Article 21(2).

TECHNICAL FIELD

The present invention relates to a Mn-containing copper alloy sputtering target (that generates only a small number of particles) and can be used to form diffusion inhibiting films and seed films of interconnects of semiconductor devices simultaneously.

BACKGROUND ART

As it is shown in FIG. 2 illustrating a partial cross section of interconnects of a semiconductor device, interconnects of semiconductor devices are known to be produced by forming a Ta metal film 3 as a diffusion inhibiting film on the surface of a substrate 1 (hereafter referred to as a substrate) coated with an insulation film such as $SiO_2$ having grooves 2 on its surfaces, forming a seed film 4 composed of pure copper on the surface of the Ta metal film 3, and forming a interconnects thin film 5 on the surface of the pure copper seed film 4 through plating or the like.

Metallic Ta used in the above-described Ta metal film 3 which is known as the diffusion inhibiting film is itself an expensive material. Therefore, development of inexpensive metal films acting as diffusion inhibiting films have been studied as alternatives to the Ta metal film. As an example of recent studies, FIG. 1 illustrates a partial cross section of the interconnects of a semiconductor device, where, by sputtering a CuMn copper alloy target, a Mn-containing copper alloy film is directly formed on the surface of the substrate 1 coated with an insulation film such as $SiO_2$ having grooves 2 on its surface, and the thus formed Mn-containing copper alloy film is subsequently subjected to a heat treatment. Mn contained in the Mn-containing copper alloy film 7 reacts with the insulation film such as $SiO_2$ on the substrate 1 and forms a layer 6 that contains complex oxides of Mn and Si. Since the Mn—Si complex oxide-containing layer 6 acts as a diffusion inhibiting film, formation of the expensive Ta metal film can be avoided. In addition, the Mn-containing copper alloy film 7 can be used as a seed film. Based on the above-described findings, extensive studies have been carried out with respect to the Mn-containing copper alloy film and the Mn—Si complex oxide-containing layer (Non Patent References 1, 2).
Non Patent Reference 1: Home Page of Semiconductor Technology Academic Research Center (STARC), June 8, Hei 17 (2005).
Non Patent Reference 2: Abstract of presentation on IITC, Jun. 8, 2005.

DISCLOSURE OF INVENTION

Problems to be Solved by the Invention

However, when the Mn-containing copper alloy target is formed by sputtering using the above-described Mn-containing copper alloy target that contains 0.6 to 30 mass % of Mn with the balance consisting of Cu and impurities, the sputtering is accompanied with a fault that a particulate is generated in large quantities, thereby reducing yields and increasing costs.

Expedients for Solving the Problems

Therefore, the inventors conducted research with the intention of obtaining a Mn-containing copper alloy target that generates only a small number of particles. As a result of the research, the following results were obtained.
A) When a Mn-containing copper alloy film is formed by sputtering using a Mn-containing copper alloy target that contains 0.6 to 30 mass % of Mn with the balance being of Cu and impurities, it is possible to reduce the generation of particles to as small an amount as the impurities contained in the Mn-containing copper alloy target has low concentration. The number of particles generated at the time of sputtering can be remarkably reduced where the impurities are extremely reduced with a total amount of 40 ppm or less of metallic impurities, 10 ppm or less of oxygen, 5 ppm or less of nitrogen, 5 ppm or less of hydrogen, and 10 ppm or less of carbon.
B) Where the Mn-containing copper alloy target has an equiaxed recrystallization (recrystallized) structure having a grain size of 30 μm or less, it is possible to further reduce the generation of particles.

Based on the above-described research results, the present invention includes the following aspects.
(1) A Mn-containing copper alloy sputtering target that generates few particles, comprising a copper alloy containing 0.6 to 30 mass % of Mn with the balance being of copper and impurities, wherein the impurities are controlled to include a total 40 ppm or less of metallic impurities, 10 ppm or less of oxygen, 5 ppm or less of nitrogen, 5 ppm or less of hydrogen, and 10 ppm or less of carbon.
(2) A Mn-containing copper alloy sputtering target that generates few particles as described in the above (1), wherein the Mn-containing copper alloy sputtering target has an equiaxed recrystallization structure with a grain size of 30 μm or less.

The Mn-containing copper alloy sputtering target of the present invention may be produced by the following process. High-purity electrolytic Mn having a purity of 99.9% or more is added to high-purity electrolytic copper having a purity of 99.9999% or more. A Mn-containing copper alloy ingot is produced by subjecting the copper and the added Mn to high-frequency melting in a high purity graphite mold in an inert gas atmosphere. A hot worked member was produced by hot working the ingot such that the termination temperature of the hot working was not lower than 450° C. Where necessary, the hot worked member is water cooled. After that, surface portion of 0.2 mm or more in thickness is removed from the member. Next, the member is subjected to repeated cold working and annealing. After the final annealing, the Mn-containing copper alloy sputtering target is obtained.

In the following, the reason for limiting the component compositions in the Mn-containing copper alloy sputtering target of the present invention is explained.
(a) Mn
The Mn component has an effect of refining crystal grains of the Mn-containing copper alloy sputtering target and suppressing the growth of the crystal grains. In addition, Mn forms a layer that contains complex oxides of Mn and Si in the boundary region between a substrate and a Mn-containing copper alloy film being formed, and the layer acts as a diffusion inhibiting film. Where the Mn content is less than 0.6 mass %, the desired effect cannot be obtained. Where the Mn content exceeds 30 mass %, thermal conductivity of the target is reduced and the temperature of the target is increased during the sputtering. In addition, resistivity of the obtained Mn-containing copper alloy film is increased and cannot be appropriately used as interconnects of a semiconductor device. Therefore, the Mn contained in the Mn-containing copper alloy sputtering target was controlled to be 0.6 to 30 mass %, preferably 1.0 to 20 mass %.

(b) Impurities

The number of particles generated during the sputtering process using the Mn-containing copper alloy sputtering target decreases with the decreasing content of impurities contained in the Mn-containing copper alloy sputtering target. Where the total amount of metallic impurities such as Fe, Ni, Cr, Si, Pb, Co, Mg, Zn exceeds 40 ppm, and nonmetallic impurities such as oxygen, nitrogen, hydrogen and carbon exceeds the set values, such that oxygen exceeds 10 ppm, nitrogen exceeds 5 ppm, hydrogen exceeds 5 ppm, or carbon exceeds 10 ppm, the generation of particles steeply increases. Therefore, impurities contained in the Mn-containing copper alloy sputtering target were controlled such that the total amount of metallic impurities was 40 ppm or less, oxygen content was 10 ppm or less, nitrogen content was 5 ppm or less, hydrogen content was 5 ppm or less, and carbon content was 10 ppm or less.

Effect of the Invention

Where the Mn-containing copper alloy film is formed using the Mn-containing copper alloy sputtering target of the present invention, excellent effects are achieved. A diffusion inhibiting layer as an alternative to the Ta metal film and a seed film are formed simultaneously, and the production cost of the film is reduced by avoiding the formation of an expensive Ta metal layer. Additionally, by reducing the numbers of particles generated in the sputtering process, it is possible to reduce the production cost of a semiconductor device or the like.

EXPLANATION OF SYMBOLS

Figure 1:
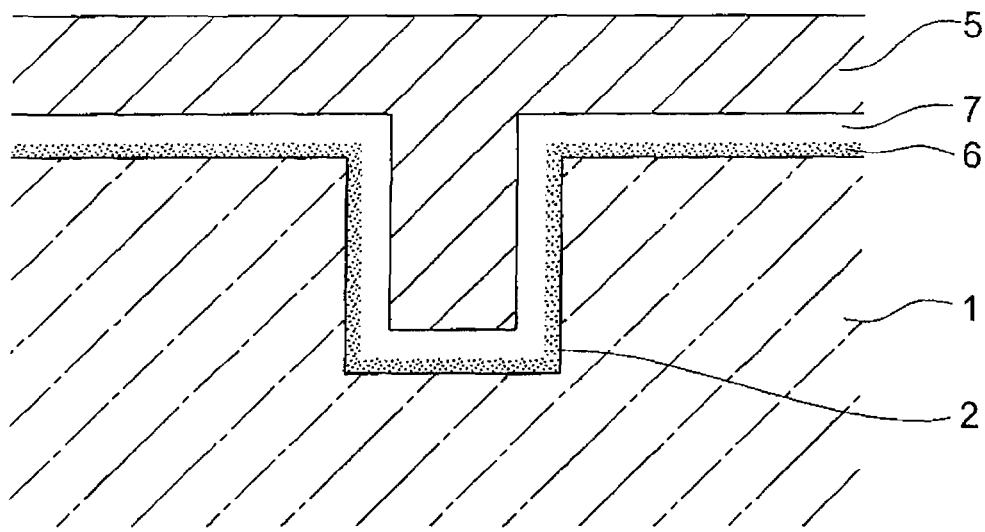
FIG. 1 is a partial cross sectional view of the interconnects of a semiconductor device which was produced by forming a seed film using a recently developed target.
Figure 2:
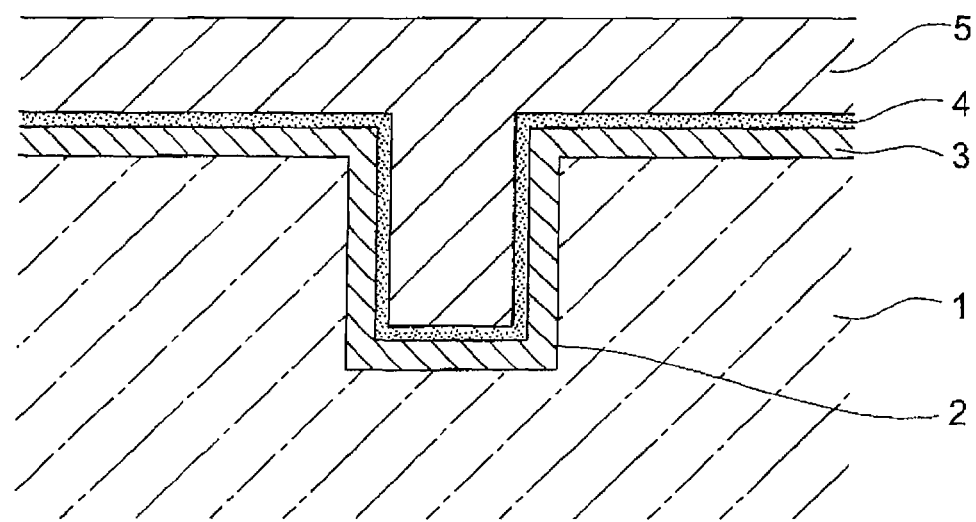
FIG. 2 is a partial cross sectional view of the interconnects of a semiconductor device which was produced by forming a seed film using a target according to the prior art.

1: substrate
2: groove
3: Ta metal film
4: pure copper seed film
5: interconnects thin film
6: Mn—Si complex oxide-containing layer
7: Mn-containing copper alloy film

BEST MODE FOR CARRYING OUT THE INVENTION

Next, a Mn-containing copper alloy sputtering target according to the present invention is explained specifically with reference to the examples.

High-purity electrolytic copper having a purity of 99.9999% or more was prepared. In addition, high-purity electrolytic Mn having a purity of 99.9% or more was prepared. The high purity electrolytic copper and various amounts of electrolytic Mn were subjected to high-frequency melting in a high-purity graphite mold within an Ar gas atmosphere. During the melting, contents of impurities were controlled by gas blowing or adding trace elements. Each of the thus obtained melts was cast in the carbon mold. The thus obtained ingot was hot-forged such that the termination temperature was not lower than 450° C. and was subjected to water cooling after the hot-forging. After that, a surface portion of 1.5 mm in thickness was removed by facing from the whole surface of the hot-forged member After facing where necessary, each of the hot-forged members was subjected to cold working and annealing. After repeating the cold working and annealing, the member was finally subjected to recrystallization annealing. The surfaces of the thus obtained annealed members were subjected to lathe working. Thus, targets 1 to 8 of the present invention and comparative targets 1 to 6, each having an outer diameter of 300 mm, a thickness of 5 mm, and a composition as shown in Table 1 were prepared.

In addition, commercially available electrolytic copper was prepared. The electrolytic Mn prepared as described-above was added to the commercially available electrolytic copper. The copper and Mn were subjected to high-frequency melting in a high-purity graphite mold within an Ar gas atmosphere. The thus obtained ingot was hot-forged such that the termination temperature was equal to or higher than 450° C. and was subjected to water cooling after the hot-forging. After that, a surface portion of 1.5 mm in thickness was ground from the whole surface of the hot-forged member.

The surface-ground hot-forged member was subjected to cold working and annealing. After repeating the cold working and annealing, the member was finally subjected to strain-relief annealing. The surfaces of the thus obtained strain-relief annealed member were subjected to a lathe working. Thus, a conventional target having an outer diameter of 300 mm, thickness of 5 mm, and a composition as shown in Table 1 was prepared. The targets 1 to 8 of the present invention, comparative targets 1 to 6, and the conventional target were sectioned, and the average crystal grain size of each cut surface was measured as shown in Table 1.

Backing plates made of pure aluminum were prepared. Each of the targets 1 to 8 of the present invention, comparative targets 1 to 6, and the conventional target were superposed on a pure aluminum backing plate and subjected to HIP treatment at a temperature of 500° C. Thus, the targets 1 to 8 of the present invention, comparative targets 1 to 6, and the conventional target were bonded to the pure aluminum backing plates, and targets having backing plates were prepared.

Using the targets having backing plates obtained by bonding the targets 1 to 8 of the present invention, comparative targets 1 to 6, and the conventional target to the pure aluminum backing plates by the HIP treatment, thin films were formed on the substrates which were preliminary coated with insulation films such as $SiO_2$. The following high output conditions were used for the film-formation.

Power supply: AC
Electric power: 4 kW
Composition of atmospheric gas: Ar
Sputter gas pressure: 1 Pa
Distance between the target and the substrate: 80 mm
Sputtering time: 5 minutes.

At that time, the number of generated particles was measured using a particle counter. The results are shown in Table. 1.

TABLE 1

| TARGET | | Mn | Cu AND IMPURITIES | COMPONENT COMPOSITION (mass %) | | | | | AVERAGE GRAIN SIZE (μm) | NUMBERS OF GENERATED PARTICLES (COUNT) |
|---|---|---|---|---|---|---|---|---|---|---|
| | | | | METALLIC IMPURITIES | IMPURITIES (ppm) | | | | | |
| | | | | | O | H | N | C | | |
| THE PESENT INVENTION | 1 | 0.6 | BALANCE | 2 | 0.2 | <0.2 | <2 | 0.5 | 27 | 8 |
| | 2 | 2 | BALANCE | 3 | 0.8 | <0.2 | <2 | 0.6 | 15 | 4 |
| | 3 | 1 | BALANCE | 8 | 3 | <0.2 | <2 | 2 | 10 | 5 |
| | 4 | 10 | BALANCE | 17 | 4 | 0.2 | <2 | 3 | 4 | 2 |
| | 5 | 16 | BALANCE | 22 | 6 | 0.3 | <2 | 4 | 5 | 4 |
| | 6 | 20 | BALANCE | 31 | 7 | 0.4 | <2 | 6 | 6 | 5 |
| | 7 | 25 | BALANCE | 35 | 9 | 0.4 | 3 | 7 | 2 | 6 |
| | 8 | 28 | BALANCE | 38 | 10 | 0.5 | 4 | 8 | 7 | 8 |
| COMPARATIVE | 1 | 0.5* | BALANCE | 2 | 0.2 | <0.2 | <2 | 0.4 | 35 | 19 |
| | 2 | 31* | BALANCE | 55* | 11 | 0.6 | <2 | 9 | 5 | 18 |
| | 3 | 9 | BALANCE | 17 | 13* | 0.2 | <2 | 3 | 4 | 19 |
| | 4 | 8 | BALANCE | 14 | 4 | 6* | <2 | 2 | 7 | 27 |
| | 5 | 10 | BALANCE | 19 | 3 | <0.2 | 6* | 3 | 7 | 17 |
| | 6 | 11 | BALANCE | 24 | 4 | 0.3 | <2 | 11* | 6 | 36 |
| CONVENTIONAL | | 10 | BALANEC | 110* | 10 | 5 | 2 | 2 | 5 | 38 |

*denotes a value outside the range of the present invention

From the results shown in Table 1, it can be understood that by specifying such that the total amount of metallic impurities was 40 ppm or less, the oxygen content was 10 ppm or less, the nitrogen content was 5 ppm or less, the hydrogen content was 5 ppm or less, and carbon content was 10 ppm or less, the inventive targets 1 to 8 generated a lesser number of particles compared to the conventional target including higher amount of impurities. On the other hand, in comparative example 1, because of too high purity of the target, the target has too large an average grain size and generated a large number of particles. Comparative targets 2 to 6 generated a large numbers of particles because of too many impurities.

The invention claimed is:

1. A Mn-containing copper alloy sputtering target that generates few particles, comprising:

a copper alloy substantially consisting of 0.6 to 30 mass % of Mn; and a balance being of copper and impurities, wherein the Mn-containing copper alloy includes copper having a purity of 99.999% or more and Mn having a purity of 99.9% or more, the impurities are controlled such that the content of metallic impurities including Fe, Ni, Cr, Si, Pb, Co, Mg and Zn is 40 ppm or less, oxygen content is 10 ppm or less, nitrogen content is 5 ppm or less, hydrogen content is 5 ppm or less, and carbon content is 10 ppm or less, and the Mn-containing copper alloy sputtering target has an equiaxed recrystallization structure having a grain size of 30 μm or less.

* * * * *